US012715945B2

(12) United States Patent
Wu et al.

(10) Patent No.: US 12,715,945 B2
(45) Date of Patent: Aug. 25, 2026

(54) COMPOSITION FOR USE IN PHOTOELECTRONIC COMPONENT PACKAGING, PACKAGING STRUCTURE, AND PHOTOELECTRONIC COMPONENT

(71) Applicant: XI'AN SMART MATERIALS CO., LTD., Shaanxi (CN)

(72) Inventors: Zhaoxin Wu, Shaanxi (CN); Ting Lei, Shaanxi (CN); Lu Li, Shaanxi (CN); Guijiang Zhou, Shaanxi (CN); Yuhong Liu, Shaanxi (CN)

(73) Assignee: XI'AN SMART MATERIALS CO., LTD., Shaanxi (CN)

(*) Notice: Subject to any disclaimer, the term of this patent is extended or adjusted under 35 U.S.C. 154(b) by 802 days.

(21) Appl. No.: 18/042,273

(22) PCT Filed: Jul. 9, 2021

(86) PCT No.: PCT/CN2021/105556

§ 371 (c)(1),
(2) Date: Feb. 20, 2023

(87) PCT Pub. No.: WO2022/037311

PCT Pub. Date: Feb. 24, 2022

(65) Prior Publication Data

US 2023/0295361 A1 Sep. 21, 2023

(30) Foreign Application Priority Data

Aug. 21, 2020 (CN) ......................... 202010852255.6

(51) Int. Cl.

| | |
|---|---|
| ***C08F 222/10*** | (2006.01) |
| *H10K 30/88* | (2023.01) |
| *H10K 50/844* | (2023.01) |

(52) U.S. Cl.

CPC .......... *C08F 222/102* (2020.02); *H10K 30/88* (2023.02); *H10K 50/844* (2023.02)

(58) Field of Classification Search

None

See application file for complete search history.

(56) References Cited

FOREIGN PATENT DOCUMENTS

| | | | |
|---|---|---|---|
| CN | 101928370 | A | 12/2010 |
| CN | 102299118 | A | 12/2011 |
| CN | 107452889 | A | 12/2017 |
| CN | 110128783 | A | 8/2019 |
| CN | 111171729 | A | 5/2020 |
| CN | 111205815 | A | 5/2020 |
| CN | 111933823 | A | 11/2020 |
| KR | 20170003169 | A | 1/2017 |

*Primary Examiner* — Sanza L. McClendon

(74) *Attorney, Agent, or Firm* — Shumaker, Loop & Kendrick, LLP; James D. Miller

(57) ABSTRACT

Disclosed are a composition for use in photoelectronic component encapsulated, an encapsulation structure and a photoelectronic component. The composition includes 10%~70% of a photocurable monomer; 10%~70% of a monofunctional or trifunctional silicon-containing monomer; and 0.5%~10% of an initiator. The use of the silicon-containing monomer, on the one hand, because of the strong distensibility of Si—O—Si chain segment of self, provides a stress dispersing effect upon impact, reduces internal stress, and increases the mechanical performance of the organic encapsulation composition; and on the other hand, effectively increases the thermal performance and hydrophobicity of the organic encapsulation composition. Film packaging for use in the photoelectronic component may effectively increase the service life of the component.

15 Claims, No Drawings

COMPOSITION FOR USE IN PHOTOELECTRONIC COMPONENT PACKAGING, PACKAGING STRUCTURE, AND PHOTOELECTRONIC COMPONENT

CROSS REFERENCE TO RELATED PATENT APPLICATIONS

This is a U.S. national phase patent application of PCT/CN2021/105556 filed Jul. 9, 2021 which claims the benefit of and priority to CN Pat. Appl. No. 202010852255.6 filed on Aug. 21, 2020, the entire contents of each of which are incorporated herein by reference.

TECHNICAL FIELD

The present disclosure belongs to the technical field of organic films, in particular to a composition for use in photoelectronic component encapsulated, an encapsulation structure and a photoelectronic component.

BACKGROUND

With the development of science and technology, the upgrading of electronic products is also changed with each passing day, and many display components are also changed from bulky and rigid to thin, folding and bending. The performance and life of the display components are partly determined by the own characteristics, and the other part is guaranteed and continued by external packaging protection. In a traditional packaging technology, a substrate used is a rigid material (such as a steel plate, acrylic, glass, ceramic and other hard materials), it lacks the flexibility, and may not fully meet the market demand.

In a thin film encapsulation technology (TFE), an inorganic barrier film may produce defects, such as cracks or shrinkage cavities, in the process of deposition. Therefore, the insertion of an organic barrier film is helpful to stabilize the inorganic barrier film and extend a water and oxygen permeation path. Packaging of photoelectronic components requires that materials must meet the requirements of high light transmittance, high curing rate, low volume shrinkage rate, high thermal stability, high water oxygen insulation and the like. Existing systems may not meet the above requirements.

SUMMARY

A technical problem to be solved by the present disclosure is to provide a composition for use in photoelectronic component encapsulated, an encapsulation structure and a photoelectronic component in view of deficiencies of the above existing technology. The reason of using a silicon-containing monomer is as follows. On the one hand, the Si—O—Si segment of the silicon-containing monomer has a strong deformation capability, and the silicon-containing monomer can have a stress dispersion function when being impacted by a force, thereby reducing an internal stress and improving the mechanical performance of an organic encapsulation composition. On the other hand, the thermal performance and hydrophobicity of the organic encapsulation composition can be effectively improved, and the thin film encapsulation used for the optoelectronic device can effectively improve the service life of the device. Film packaging for use in the photoelectronic component may effectively increase the service life of the component.

The present disclosure adopts the following technical schemes.

A composition for use in photoelectronic component encapsulated, including a photocurable monomer, a monofunctional or trifunctional silicon-containing monomer and an initiator, and the monofunctional silicon-containing monomer is as follows.

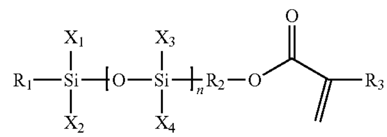

Herein R1 is a substituted or unsubstituted C1 to C30 alkyl or alkoxy, or a substituted or unsubstituted C6 to C30 aryl; R2 is a single bond; a substituted or unsubstituted C1 to C20 alkylene; a substituted or unsubstituted C1 to C30 alkyleneoxy, a substituted or unsubstituted C6 to C30 arylene, or a substituted or unsubstituted C7 to C30 aryl alkylene; R3 is hydrogen, or a substituted or unsubstituted C1 to C30 alkyl; X1, X2, X3, and X4 are the same or different; and each independently substituted or unsubstituted C1 to C30 alkyl or alkoxy, or a substituted or unsubstituted C6 to C30 aryl; and n is an integer of 0~30, or the average is within 0~30.

The trifunctional silicon-containing monomer is as follows.

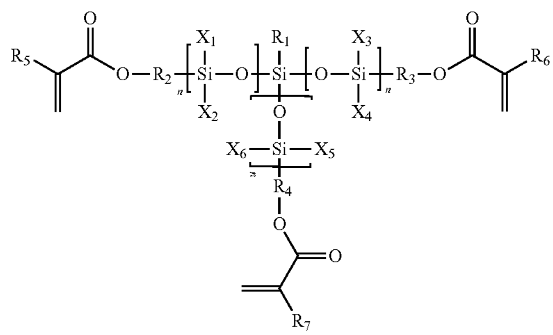

Herein R1 is a substituted or unsubstituted C1 to C30 alkyl or alkoxy, or a substituted or unsubstituted C6 to C30 aryl; R2, R3 and R4 are a single bond, a substituted or unsubstituted C1 to C20 alkylene, a substituted or unsubstituted C1 to C30 alkyleneoxy, a substituted or unsubstituted C6 to C30 arylene, or a substituted or unsubstituted C7 to C30 aryl alkylene; R5, R6 and R7 are hydrogen, or a substituted or unsubstituted C1 to C30 alkyl; X1, X2, X3, X4, X5, and X6 are the same or different, and each independently selected from a substituted or unsubstituted C1 to C30 alkyl or alkoxy, or a substituted or unsubstituted C6 to C30 aryl; and n is an integer of 0~30, or the average is within 0~30.

Specifically, the silicon-containing monomer contains at least one C6 to C30 substituted or unsubstituted aryl bonded to a silicon atom.

Specifically, the silicon-containing monomer has a molecular weight of 200~2000 g/mol.

Further, the silicon-containing monomer includes the following structures:
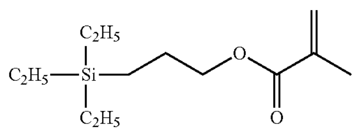
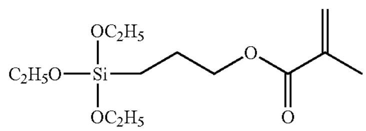
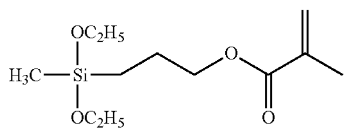
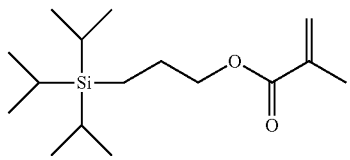
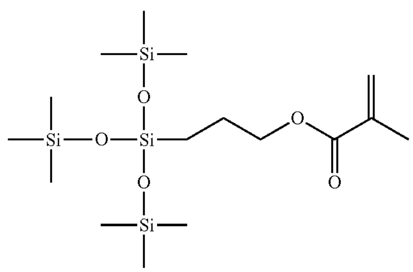
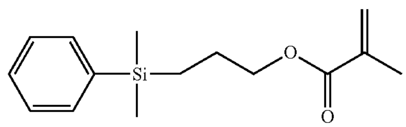
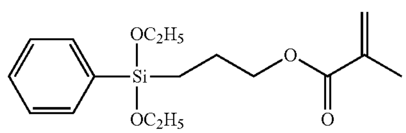
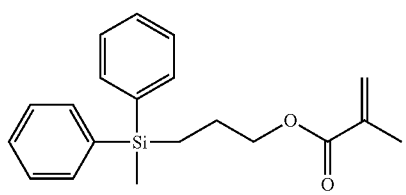
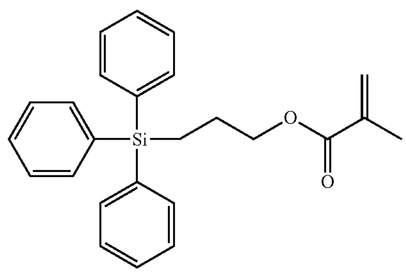
-continued
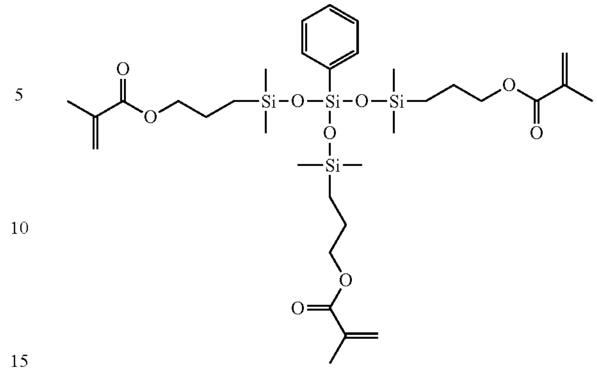
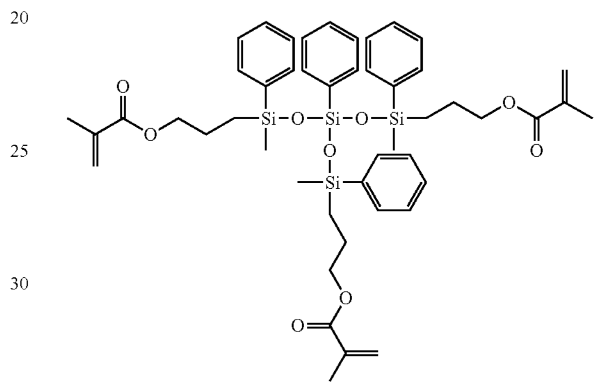
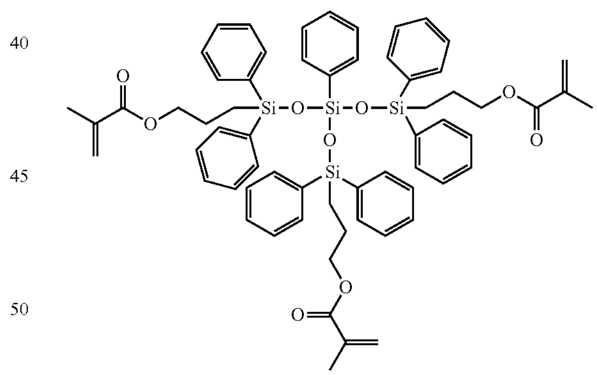
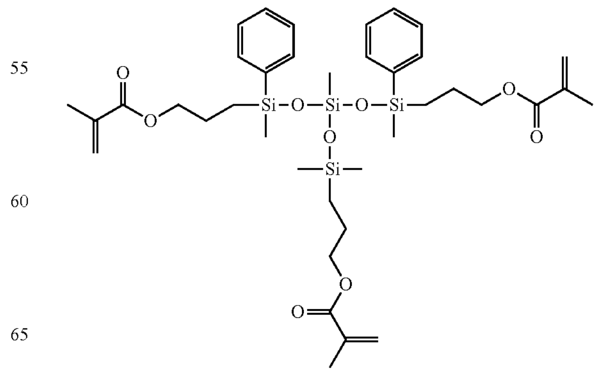

-continued

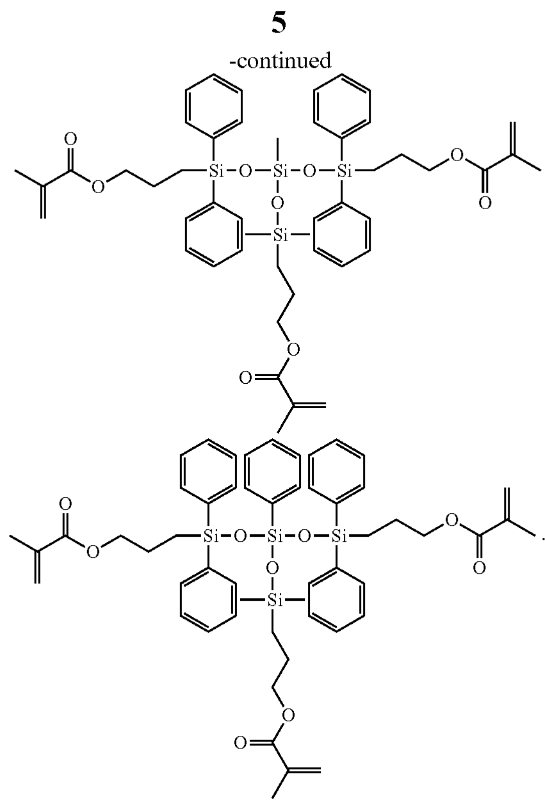

Specifically, calculated by the weight percentage in the composition, the photocurable monomer is 10%~85%; the monofunctional or trifunctional silicon-containing monomer is 10%~70%; and the initiator is 0.5%~10%.

Specifically, calculated by the weight percentage in the composition, the monofunctional or trifunctional silicon-containing monomer is 20%~50%, the photocurable monomer is 30%~70%, and the initiator is 0.5%~10%.

Specifically, the photocurable monomer includes at least one of C1 to C30 monoalcohol or polyalcohol monofunctional (meth) acrylate, C2 to C30 monoalcohol or polyalcohol bifunctional (meth) acrylate and C3 to C30 monoalcohol or polyalcohol multifunctional (meth) acrylate.

The mass ratio of the monofunctional acrylate to bifunctional acrylate is 1:(0.1~20), and the mass ratio of the monofunctional acrylate to the multifunctional acrylate is 1:(0.1~20).

Specifically, the photoinitiator is one or variety of triazine, acetophenone, benzophenone, thioxanthone, benzoin, phosphorus, and oxime initiators or a mixture thereof.

Another technical scheme of the present disclosure is: an encapsulation structure, herein a packaging layer is formed by ultraviolet light irradiation after the composition for use in photoelectronic component encapsulated is attached in any one mode of flash evaporation, ink-jet printing, deposition, screen printing, spin coating or scraper coating.

Another technical scheme of the present disclosure is: a photoelectronic component, including a functional structure and an encapsulation structure, herein the encapsulation structure is the above encapsulation structure, the photoelectronic component is an organic light-emitting diode or a solar battery, the light curing rate is 90%~97%, and the light transmittance is 95%~99%.

Compared with an existing technology, the present disclosure at least has the following beneficial effects.

The present disclosure discloses a composition for use in photoelectronic component encapsulated, including the photocurable monomer, the monofunctional or trifunctional silicon-containing monomer and the photoinitiator. The viscosity, curing rate, light transmittance and the like of the encapsulation composition may be adjusted by adjusting the mixing proportion of the three ingredients to achieve the preparation of an efficient and stable packaging protective layer.

Further, the monofunctional or trifunctional silicon-containing monomer may effectively improve the heat resistance and corrosion resistance of the encapsulation composition.

Further, the monofunctional or trifunctional silicon-containing monomer has good ink jet printing or spin coating performance in the molecular weight range of 200~2000 g/mol.

Further, because it has a larger steric hindrance, the monofunctional or trifunctional silicon-containing monomer may effectively reduce the volume shrinkage caused by curing.

Further, the mass ratio of the encapsulation composition ingredients is as follows: the mass ratio of the photocurable monomer is 10%~85%, the mass ratio of the silicon-containing monomer is 10%~70%, and the mass ratio of the photoinitiator is 0.1%~10%. Within this range, the encapsulation composition may be cured to form the effective organic protective layer.

Further, the preferred mass ratio of the encapsulation composition ingredients is as follows: the mass ratio of the photocurable monomer is 30%~70%, the mass ratio of the silicon-containing monomer is 20%~50%, and the mass ratio of the photoinitiator is 0.1%~10%. Within this range, the encapsulation composition has the best ink-jet printing or spin coating performance.

Further, the photocurable monomer is a silicon-free monoalcohol or polyalcohol acrylate monomer. This type of materials has a higher curing rate and light transmittance and has the lower viscosity at a normal temperature, and may effectively adjust the viscosity, the light curing rate and the like of the encapsulation composition.

Further, most of the photoinitiators are a phosphorus initiator, this system of the initiators has a good solubility with the monomer, and the absorption wavelength may reach 430 nm. It is suitable for a colored light ultraviolet curing system. In addition, it is colorless after decomposition, and has excellent yellowing resistance.

In conclusion, the composition for photoelectronic component encapsulated disclosed in the present disclosure has high light transmittance, high curing rate, low volume shrinkage rate, high heat resistance, yellowing resistance and good ink-jet printing performance.

The technical schemes of the present disclosure are further described in detail below by embodiments.

DETAILED DESCRIPTION OF THE EMBODIMENTS

The present disclosure discloses a composition for use in photoelectronic component encapsulated, calculated by the weight percentage, including: 10%~70% of a photocurable monomer; 10%~70% of a monofunctional or trifunctional silicon-containing monomer; and 0.5%~10% of an initiator.

The monofunctional silicon-containing monomer is as follows.

(1)

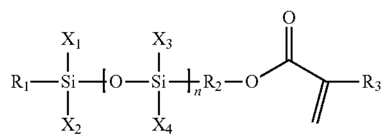

Herein R1 is a substituted or unsubstituted C1 to C30 alkyl or alkoxy, or a substituted or unsubstituted C6 to C30 aryl; R2 is a single bond, a substituted or unsubstituted C1 to C20 alkylene, a substituted or unsubstituted C1 to C30 alkyleneoxy, a substituted or unsubstituted C6 to C30 arylene, or a substituted or unsubstituted C7 to C30 aryl alkylene; R3 is hydrogen, or a substituted or unsubstituted C1 to C30 alkyl; X1, X2, X3, and X4 are the same or different; and each independently selected from a substituted or unsubstituted C1 to C30 alkyl or alkoxy, or a substituted or unsubstituted C6 to C30 aryl; and n is an integer of 0~30, or the average is within 0~30.

The trifunctional silicon-containing monomer is as follows.

(2)

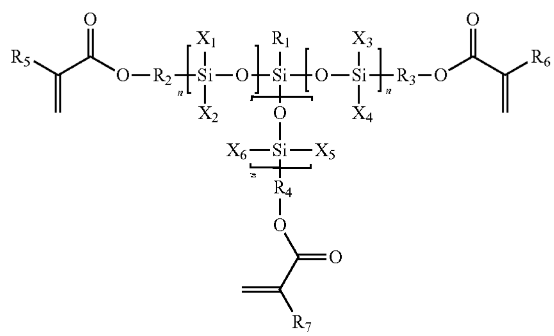

Herein R1 is a substituted or unsubstituted C1 to C30 alkyl or alkoxy, or a substituted or unsubstituted C6 to C30 aryl; R2, R3 and R4 are a single bond, a substituted or unsubstituted C1 to C20 alkylene, a substituted or unsubstituted C1 to C30 alkyleneoxy, a substituted or unsubstituted C6 to C30 arylene, or a substituted or unsubstituted C7 to C30 aryl alkylene; R5, R6 and R7 are hydrogen, or a substituted or unsubstituted C1 to C30 alkyl; X1, X2, X3, X4, X5, and X6 are the same or different, and each independently selected from a substituted or unsubstituted C1 to C30 alkyl or alkoxy, or a substituted or unsubstituted C6 to C30 aryl; and n is an integer of 0~30, or the average is within 0~30.

The silicon-containing monomer contains at least one C6 to C30 substituted or unsubstituted aryl bonded to a silicon atom. On the one hand, the heat resistance of the encapsulation composition is improved, and on the other hand, the volume shrinkage of the encapsulation composition produced during curing is reduced.

The silicon-containing monomer includes at least one of the following structures:

(3)

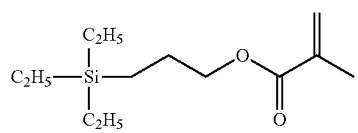

(4)

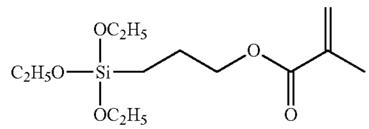

(5)

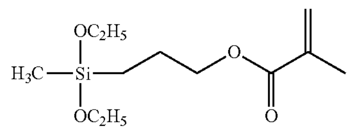

(6)

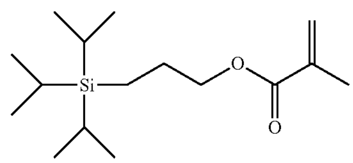

(7)

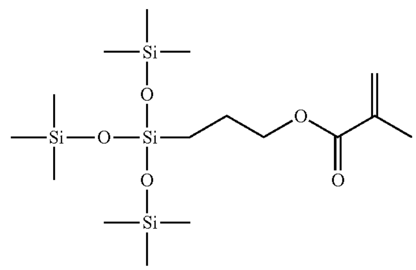

(8)

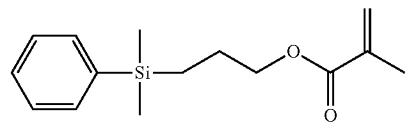

(9)

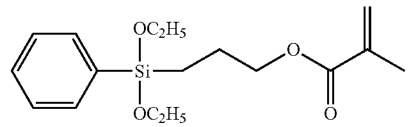

(10)

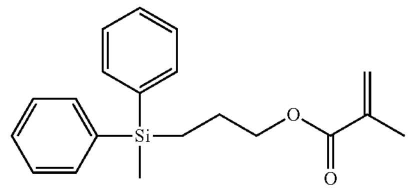

(11)

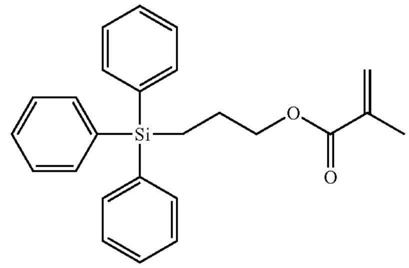

-continued (12)

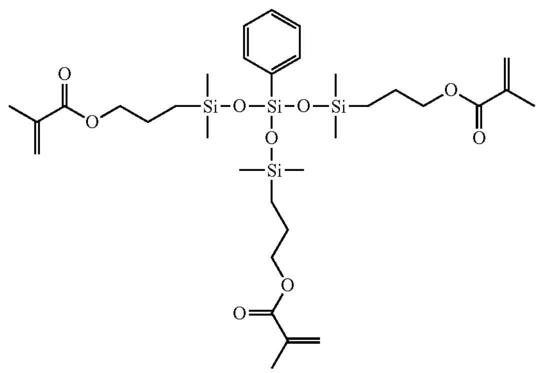

(13)

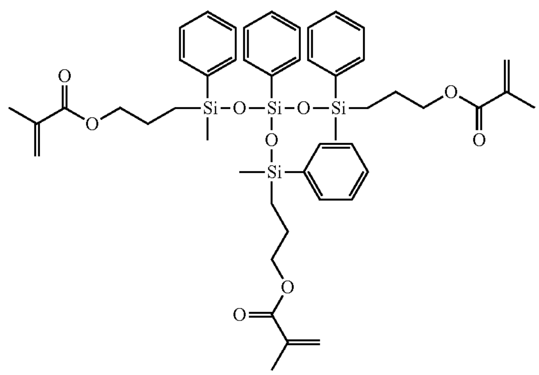

(14)

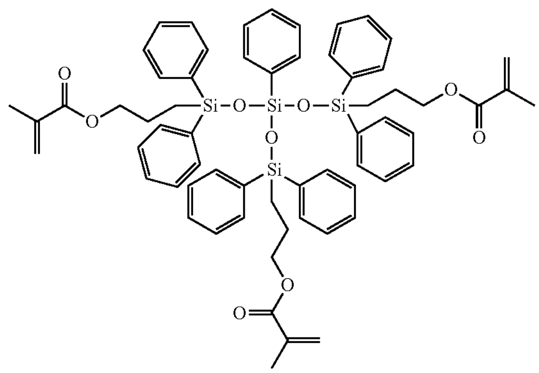

(15)

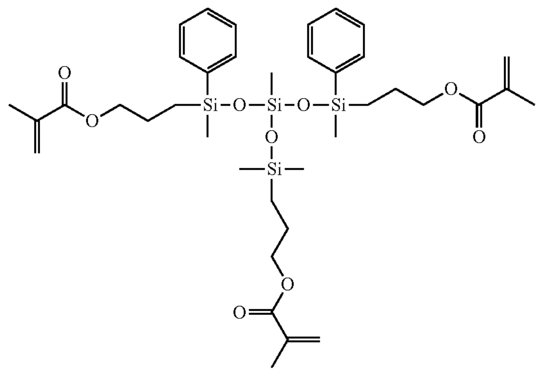

-continued (16)

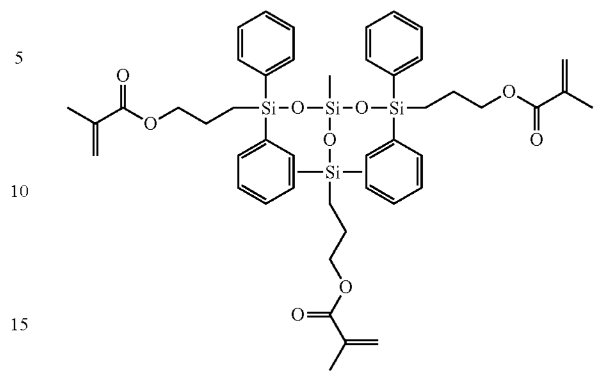

(17)

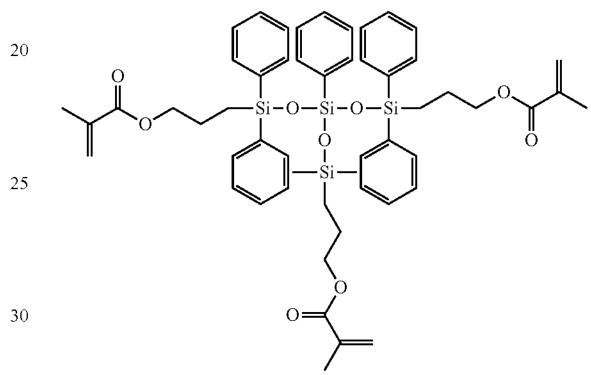

Preferably, the silicon-containing monomer has a molecular weight of 200~2000 g/mol.

The monofunctional or trifunctional silicon-containing monomer accounts for 30%~50% of the composition.

The photocurable monomer is a photocurable monomer excluding the silicon-containing monomer; the photocurable monomer may be a non-silicon photocurable monomer that does not contain silicon and contains a photocurable functional group, such as a (meth) acrylate group, or a vinyl. The photocurable monomer may also be a monofunctional monomer, a bifunctional monomer, a multifunctional monomer or a mixture.

The "monofunctional" monomer refers to a monomer containing one photocurable functional group; the "bifunctional" monomer refers to a monomer containing two photocurable functional groups; and the "multifunctional" monomer refers to a monomer containing three or more than three photocurable functional groups.

The photocurable monomer preferably contains two to four photocurable functional groups. The photocurable monomer may also be a mixture of the monofunctional curable monomer, the bifunctional curable monomer and the multifunctional curable monomer.

In the mixture, the monofunctional curable monomer and the bifunctional curable monomer or multifunctional curable monomer are mixed in a ratio of 1:(0.1~20).

The photocurable monomer includes at least one of the following types:

C1 to C30 monoalcohol or polyalcohol monofunctional (meth) acrylate;

C2 to C30 monoalcohol or polyalcohol bifunctional (meth) acrylate; and

C3 to C30 monoalcohol or polyalcohol multifunctional (meth) acrylate.

The monofunctional photocurable monomer may be classified into alkyl acrylate, hydroxy (meth) acrylate, (meth) acrylate with a ring structure or a benzene ring, and a vinyl monomer and the like according to the different structures.

The photoinitiators include any typical photopolymerization initiators capable of performing a photocuring reaction, specifically including at least one of triazine, acetophenone, benzophenone, thioxanthone, benzoin, phosphorus, and oxime initiators or a mixture thereof. For example, the phosphorus initiator may contain dibenzoylphenylphosphine oxide, benzoyl diphenylphosphine oxide, and a mixture thereof. Under 365~430 nm of ultraviolet (UV) light, the phosphorus initiator may effectively improve the photoinitiation performance without damaging the luminous performance of the organic photoelectronic component, and is widely used.

A use method of the composition for use in photoelectronic component encapsulated is as follows: firstly, it is uniformly attached to the component surface to be encapsulated in any one mode of flash evaporation, ink-jet printing, deposition, screen printing, spin coating or scraper coating. And then an organic barrier film is promoted to form by UV light irradiation.

In the present disclosure, in view of the balance and control between performance and cost, the ink-jet printing is the optimal use method. In the present disclosure, the encapsulation composition is printed in thickness of 0.1~20 μm by the ink-jet printing mode, and then it is irradiated for about 1~50 seconds under UV in the range of 10~500 $mW/cm^2$, so that it is cured to obtain an organic film barrier layer.

The composition for use in photoelectronic component encapsulated may be used as an UV curable material of an organic photoelectronic component encapsulated layer, and may also be used for Organic Light-Emitting Diode (OLED) display component packaging.

The composition for encapsulating an organic light-emitting diode has a light curing rate of 90%~97%. Within this range, the encapsulated layer may suffer from the offset caused by the low curing shrinkage stress after curing, so the composition may be used for encapsulating the photoelectronic component. The composition for packaging the organic light-emitting diode may have a light transmittance of 95%~99% after curing.

The composition for use in photoelectronic component encapsulated disclosed in the present disclosure is used for encapsulating an OLED component. And the composition forms the organic barrier layer in the encapsulation structure in which the inorganic barrier layer and the organic barrier layer are formed successively. Specifically, the composition for encapsulating may be used for a flexible organic light-emitting diode display.

The flexible OLED component includes: an organic light-emitting diode, and a stacking layer of an inorganic layer and an organic layer for encapsulating.

An OLED component device includes a substrate Indium Tin Oxide (ITO), an organic light-emitting diode formed on the substrate, and a staking layer formed on the encapsulation component and the staking layer including an inorganic barrier layer, an organic barrier layer, and an inorganic barrier layer.

An OLED structure includes but is not limited to the stacking of the following layers of structures: ITO (transparent indium tin oxide glass) as a positive electrode and a substrate, a hole injection layer, a hole transport layer, an electron barrier layer, a light-emitting layer, a hole barrier layer, an electron transport layer, an electron injection layer, and a negative electrode metal electrode.

The barrier stacking layer contains the inorganic barrier layer and the organic barrier layer, and the inorganic barrier layer and the organic barrier layer are composed of different ingredients, thereby the respective functions of encapsulating the organic light-emitting diode are achieved.

The ingredients contained in the inorganic barrier layer are different from that of the organic barrier layer, thus the influence of the organic barrier layer is supplemented. The inorganic barrier layer is formed by an inorganic material with excellent light transmittance and excellent moisture and/or oxygen barrier properties.

For example, the inorganic barrier layer contains at least one of the followings: a metal; a non-metal; a compound or an alloy of at least two metals; a compound or an alloy of at least two non-metals; an oxide of the metal, the non-metal or the mixture thereof; a fluoride of the metal, the non-metal or the mixture thereof; a nitride of the metal, the non-metal or the mixture thereof; a carbide of the metal, the non-metal or the mixture thereof; a nitrogen oxide of the metal, the non-metal or the mixture thereof; a boride of the metal, the non-metal or the mixture thereof; a boron oxide of the metal, the non-metal or the mixture thereof; a silicide of the metal, the non-metal or the mixture thereof; and a mixture thereof.

The metal or non-metal includes, but is not limited to, silicon (Si), aluminum (Al), selenium (Se), zinc (Zn), antimony (Sb), indium (In), germanium (Ge), tin (Sn), bismuth (Bi), a transition metal, and a lanthanide metal.

Specifically, the inorganic barrier layer is a silicon oxide ($SiO_x$), a silicon nitride ($SiN_x$), a silicon oxynitride ($SiO_xN_y$), a zinc selenide (ZnSe), a zinc oxide (ZnO), an antimony trioxide ($Sb_2O_3$), an aluminum oxide ($AlO_x$) containing the aluminum oxide ($Al_2O_3$), an indium oxide ($In_2O_3$) or a tin oxide ($SnO_2$).

The inorganic barrier layer is deposited by a plasma processes or a vacuum processes, such as sputtering, chemical vapor deposition, plasma chemical vapor deposition, evaporation, sublimation, electron cyclotron resonance-plasma enhanced chemical vapor deposition, or a combination thereof. The organic barrier layer and the inorganic barrier layer are alternately deposited, as to ensure the smooth characteristics of the inorganic barrier layer and prevent the defects of the inorganic barrier layer from diffusing to other inorganic barrier layers.

In order to make purposes, technical schemes and advantages of embodiments of the present disclosure more clear, the technical schemes in the embodiments of the present disclosure are clearly and completely described below in combination with drawings in the embodiments of the present disclosure. Apparently, the described embodiments are a part of the embodiments of the present disclosure, not all of the embodiments. The components of the embodiments of the present disclosure which are generally described and illustrated in the drawings herein may be arranged and designed by various different configurations. Therefore, the following detailed description of the embodiments of the present disclosure provided in the drawings is not intended to limit the scope of the present disclosure to be protected, but merely represents the selected embodiments of the present disclosure. Based on the embodiments in the present disclosure, all other embodiments obtained by those of ordinary skill in the art without creative work belong to a scope of protection of the present disclosure.

Embodiment 1: Preparation of Encapsulation Composition 1

Ingredients used are described as follows:

(A) Silicon-containing monomer: (A1) a monomer of Formula 5, and (A2) a monomer of Formula 9;

(B) Photocurable monomer: (B1) (meth) acrylic acid 2-phenylethyl ester, and (B2) glycerol diacrylate; and (C) Initiator: benzyl (diphenyl) phosphine oxide.

In a brown glass bottle, 10% (A1), 40% (B1), 45% (B2) and 5% (C) of the total mass are added. And after being shaken and mixed at a room temperature for 2 h, it is filtered to obtain the composition 1 for encapsulating. And then, the composition is painted on the surface of an ITO substrate by ink-jet printing to form a sample of which the area is 10 cm×10 cm×10 um (length×width×thickness). Then the encapsulation composition is ultraviolet-cured with a 100 $mW/cm^2$ UV curing device for 10~30 seconds, to form an encapsulating protective film finally.

The performance evaluation of packaging ink is as follows:

Light curing rate: FT-IR (Nicolet iS10, Thermo) is used to measure the absorption peak intensity of the encapsulation composition and the cured encapsulating protective film at 1635 $cm^{-1}$ (C═C) and 1720 $cm^{-1}$ (C═O).

The light curing rate is as follows:

$$\text{Light curing rate } (\%)=|1-(F/S)|\times 100.$$

Herein, F is the ratio of the absorption peak intensity of the cured encapsulating protective film near 1635 $cm^{-1}$ to the absorption peak intensity near 1720 $cm^{-1}$; and S is the ratio of the absorption peak intensity of the encapsulation composition near 1635 $cm^{-1}$ to the absorption peak intensity near 1720 $cm^{-1}$.

Light transmittance: the encapsulation composition forms a sample by ink-jet printing, and then forms a light curing film by ultraviolet curing. The transmittance of the curing film in the visible light range of 400~700 nm is measured by an ultraviolet-visible spectrophotometer.

Volume shrinkage rate: the volume shrinkage rate reflects a volume collapse change of the encapsulation composition before and after curing, and is calculated as follows:

$$\eta=(Vb-Va)/Vb\times 100\%$$

Herein Vb is the volume before curing, and Va is the volume after curing. The volume shrinkage rate is larger, the collapse formed by the film is greater, and the packaging protection effect is worse.

Embodiment 2: Preparation of Encapsulation Composition 2

Ingredients used in Embodiment 2 are described in detail as follows.

(A) Silicon-containing monomer: (A1) a monomer of Formula 5, and (A2) a monomer of Formula 9.

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 10% (A2), 40% (B1), 20% (B2) and 5% (C) of the total mass are added. And after being shaken and mixed at a room temperature for 2 h, it is filtered to obtain the composition 2 for packaging. And then, the composition is painted on the surface of an ITO substrate by ink-jet printing to form a sample of which the area is 10 cm×10 cm×10 μm (length×width×thickness). Then the encapsulation composition is ultraviolet-cured with a 100 $mW/cm^2$ UV curing device for 10~30 seconds, to form an encapsulating protective film finally.

Embodiment 3: Preparation of Encapsulation Composition 3

Ingredients used in Embodiment 3 are described in detail as follows.

(A) Silicon-containing monomer: (A1) a monomer of Formula 5, and (A2) a monomer of Formula 9.

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 70% (A1), 5% (B1), 25% (B2) and 5% (C) of the total mass are added. And after being shaken and mixed at a room temperature for 2 h, it is filtered to obtain the composition 3 for encapsulating. And then, the composition is painted on the surface of an ITO substrate by ink-jet printing to form a sample of which the area is 10 cm×10 cm×10 μm (length×width×thickness). Then the encapsulation composition is ultraviolet-cured with a 100 $mW/cm^2$ UV curing device for 10~30 seconds, to form an encapsulating protective film finally.

Embodiment 4: Preparation of Encapsulation Composition 4

Ingredients used in Embodiment 4 are described in detail as follows.

(A) Silicon-containing monomer: (A1) a monomer of Formula 5, and (A2) a monomer of Formula 9.

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 70% (A2), 5% (B1), 25% (B2) and 5% (C) of the total mass are added. And after being shaken and mixed at a room temperature for 2 h, it is filtered to obtain the composition 4 for encapsulating. And then, the composition is painted on the surface of an ITO substrate by ink-jet printing to form a sample of which the area is 10 cm×10 cm×10 μm (length×width×thickness). Then the encapsulation composition is ultraviolet-cured with a 100 $mW/cm^2$ UV curing device for 10~30 seconds, to form an encapsulating protective film finally.

Embodiment 5: Preparation of Encapsulation Composition 5

Ingredients used in Embodiment 5 are described in detail as follows.

(A) Silicon-containing monomer: (A1) a monomer of Formula 5, and (A2) a monomer of Formula 9.

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 30% (A2), 20% (B1), 45% (B2) and 5% (C) of the total mass are added. And after being shaken and mixed at a room temperature for 2 h, it is filtered to obtain the composition 5 for encapsulating. And then, the composition is painted on the surface of an ITO substrate by ink-jet printing to form a sample of which the area is 10 cm×10 cm×10 μm (length×width×thickness). Then the encapsulation composition is ultraviolet-cured with a 100 $mW/cm^2$ UV curing device for 10~30 seconds, to form an encapsulating protective film finally.

| | | Embodiment | | | | |
|---|---|---|---|---|---|---|
| | | 1 | 2 | 3 | 4 | 5 |
| A | A1 | 10 | | –70 | — | — |
| | A2 | — | 10 | | 70 | –30 |
| B | B1 | 40 | 40 | 5 | 5 | 20 |
| | B2 | 45 | 45 | 20 | 20 | 45 |
| C | C | 5 | 5 | 5 | 5 | 5 |
| Light curing rate (%) | | 94.56 | 94.33 | 91.18 | 90.84 | 93.69 |
| Light transmittance (%) | | 98.65 | 98.48 | 98.22 | 98.13 | 98.37 |
| Volume shrinkage rate (%) | | 3.36 | 3.17 | 2.21 | 1.25 | 1.84 |

Contrast Example 6: Preparation of Encapsulation Composition in Contrast Example 6

Ingredients used in Contrast example 6 are described in detail as follows.

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 90% (B1), 5% (B2) and 5% (C) of the total mass are added. And after being shaken and mixed at a room temperature for 2 h, it is filtered to obtain the composition 6 for packaging. And then, the composition is painted on the surface of an ITO substrate by ink-jet printing to form a sample of which the area is 10 cm×10 cm×10 μm (length×width×thickness). Then the encapsulation composition is ultraviolet-cured with a 100 mW/cm$^2$ UV curing device for 10~30 seconds, to form an encapsulating protective film finally.

Contrast Example 7: Preparation of Encapsulation Composition in Contrast Example 7

Ingredients used in Contrast example 7 are described in detail as follows:

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 75% (B1), 20% (B2) and 5% (C) of the total mass are added. And after being shaken and mixed at a room temperature for 2 h, it is filtered to obtain the composition 7 for packaging. And then, the composition is painted on the surface of an ITO substrate by ink-jet printing to form a sample of which the area is 10 cm×10 cm×10 μm (length×width×thickness). Then the encapsulation composition is ultraviolet-cured with a 100 mW/cm$^2$ UV curing device for 10~30 seconds, to form an encapsulating protective film finally.

Contrast Example 8: Preparation of Encapsulation Composition in Contrast Example 8

Ingredients used in Contrast example 8 are described in detail as follows.

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 50% (B1), 45% (B2) and 5% (C) of the total mass are added. And after being shaken and mixed at a room temperature for 2 h, it is filtered to obtain the composition 8 for packaging. And then, the composition is painted on the surface of an ITO substrate by ink-jet printing to form a sample of which the area is 10 cm×10 cm×10 μm (length×width×thickness). Then the encapsulation composition is ultraviolet-cured with a 100 mW/cm$^2$ UV curing device for 10~30 seconds, to form an encapsulating protective film finally.

Contrast Example 9: Preparation of Encapsulation Composition in Contrast Example 9

Ingredients used in Contrast example 9 are described in detail as follows:

(B) Photocurable monomer: (B1) (meth) acrylic acid 2-phenylethyl ester, and (B2) glycerol diacrylate.

(C) Initiator: benzyl (diphenyl) phosphine oxide.

In a brown glass bottle, 25% (B1), 70% (B2) and 5% (C) of the total mass are added. And after being shaken and mixed at a room temperature for 2 h, it is filtered to obtain the composition 9 for packaging. And then, the composition is painted on the surface of an ITO substrate by ink-jet printing to form a sample of which the area is 10 cm×10 cm×10 μm (length×width×thickness). Then the encapsulation composition is ultraviolet-cured with a 100 mW/cm$^2$ UV curing device for 10~30 seconds, to form an encapsulating protective film finally.

| | | Contrast example | | | |
|---|---|---|---|---|---|
| | | 6 | 7 | 8 | 9 |
| A | A1 | | | | |
| | A2 | | | | |
| B | B1 | 90 | 75 | 50 | 25 |
| | B2 | 5 | 20 | 45 | 70 |
| C | C | 5 | 5 | 5 | 5 |
| | Light curing rate (%) | 92.36 | 92.85 | 93.53 | 94.26 |
| | Light transmittance (%) | 98.12 | 98.27 | 98.33 | 98.52 |
| | Volume shrinkage rate (%) | 2.26 | 2.64 | 3.48 | 4.29 |

It may be seen from the above embodiments that the increase of the mass ratio of the silicon-containing monomer may reduce the volume shrinkage rate of the encapsulation composition, but at the same time, the light curing rate and the light transmittance are reduced. The increase of the mass ratio of the photocurable monomer may enhance the light curing rate and the light transmittance of the encapsulation composition, but the volume shrinkage rate is increased. According to the above contrast examples, the introduction of the monofunctional or trifunctional silicon-containing monomer may effectively reduce the volume shrinkage rate of the system. According to the above examples and the ink-jet printing requirements, the final preferred ingredient ratio of the encapsulation composition is: the mass ratio of the silicon-containing monomer is 30%~50%, the mass ratio of the photocurable monomer is 30%~70%, and the mass ratio of photoinitiator is 2%~8%.

In conclusion, the present disclosure discloses a composition for use in photoelectronic component encapsulated, an encapsulation structure and a photoelectronic component. The ingredients and mass ratio of the encapsulation composition are as follows: the mass ratio of the photocurable monomer is 10-85%, the mass ratio of the monofunctional or trifunctional silicon-containing monomer is 10-70%, and the mass ratio of the photoinitiator is 0.1-10%. The encapsulation composition may form a film by ink-jet printing, spin coating and other modes, and may further form an organic protective layer by ultraviolet curing. The organic protective layer prepared by the encapsulation composition has the characteristics of high curing rate, high light transmittance, low volume shrinkage rate, high heat resistance, low yellowing and the like, and may be effectively used in packaging protection applications of the photoelectronic component.

The above content is only to explain the technical idea of the present disclosure, and may not limit a scope of protection of the present disclosure. Any changes made on the basis of the technical schemes according to the technical idea provided by the present disclosure falls within the scope of protection of the claims of the present disclosure.

The invention claimed is:

1. A composition for use in photoelectronic component encapsulated, comprising a photocurable monomer, a monofunctional or trifunctional silicon-containing monomer and an initiator, wherein the monofunctional silicon-containing monomer is as follows:

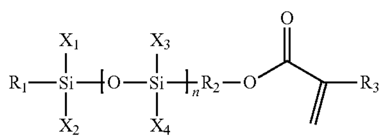

wherein R1 is a substituted or unsubstituted C1 to C30 alkyl or alkoxy, or a substituted or unsubstituted C6 to C30 aryl; R2 is a single bond, a substituted or unsubstituted C1 to C20 alkylene, a substituted or unsubstituted C1 to C30 alkyleneoxy, a substituted or unsubstituted C6 to C30 arylene, or a substituted or unsubstituted C7 to C30 aryl alkylene; R3 is hydrogen, or a substituted or unsubstituted C1 to C30 alkyl; X1, X2, X3, and X4 are the same or different, and each independently selected from a substituted or unsubstituted C1 to C30 alkyl or alkoxy, or a substituted or unsubstituted C6 to C30 aryl; and n is an integer of 0~30, or the average is within 0~30; and the trifunctional silicon-containing monomer is as follows:

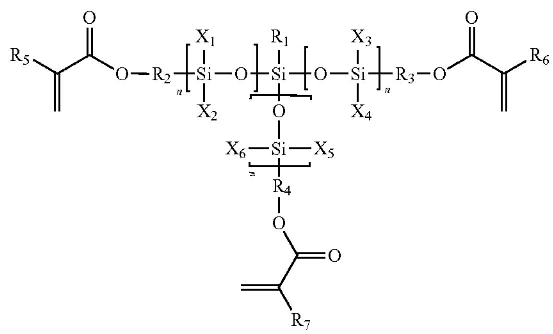

wherein R1 is a substituted or unsubstituted C1 to C30 alkyl or alkoxy, or a substituted or unsubstituted C6 to C30 aryl; R2, R3 and R4 are a single bond, a substituted or unsubstituted C1 to C20 alkylene, a substituted or unsubstituted C1 to C30 alkyleneoxy, a substituted or unsubstituted C6 to C30 arylene, or a substituted or unsubstituted C7 to C30 aryl alkylene; R5, R6 and R7 are hydrogen, or a substituted or unsubstituted C1 to C30 alkyl; X1, X2, X3, X4, X5, and X6 are the same or different, and each independently selected from a substituted or unsubstituted C1 to C30 alkyl or alkoxy, or a substituted or unsubstituted C6 to C30 aryl; and n is an integer of 0~30, or the average is within 0~30, at least one of the silicon-containing monomer contains at least one C6 to C30 substituted or unsubstituted aryl bonded to a silicon atom.

2. The composition for use in photoelectronic component encapsulated according to claim 1, wherein the silicon-containing monomer has a molecular weight of 200~2000 g/mol.

3. The composition for use in photoelectronic component encapsulated according to claim 1, wherein the silicon-containing monomer comprises the following structures:

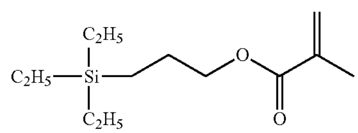

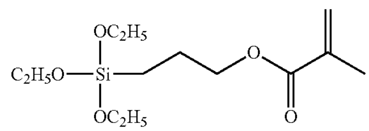

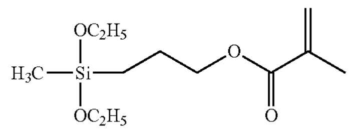

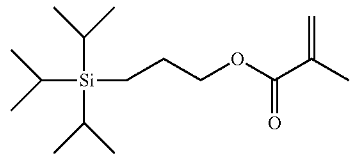

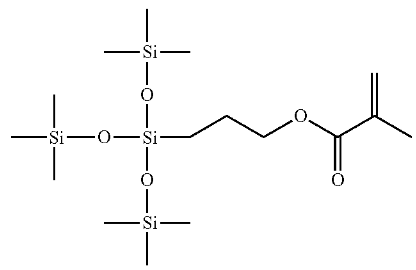

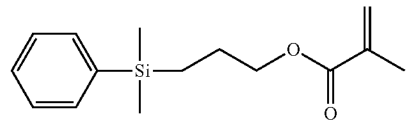

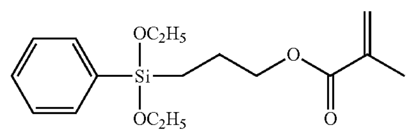

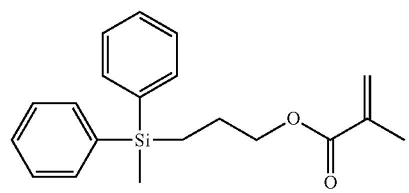

-continued

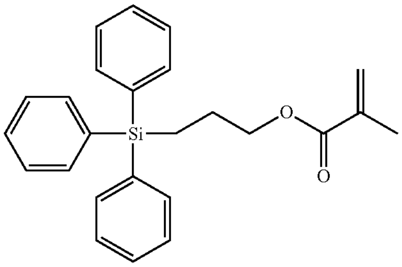

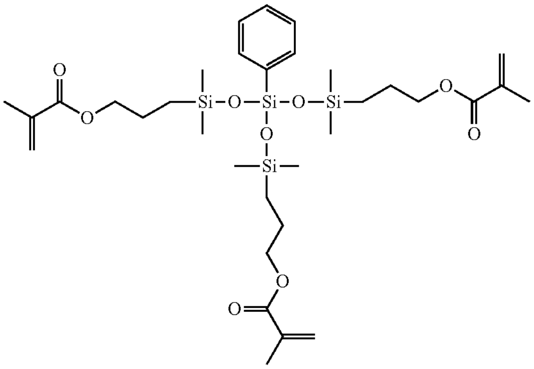

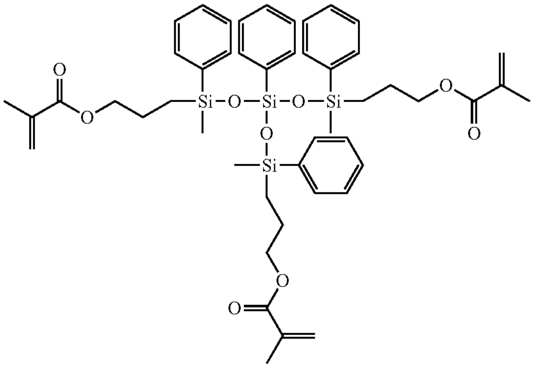

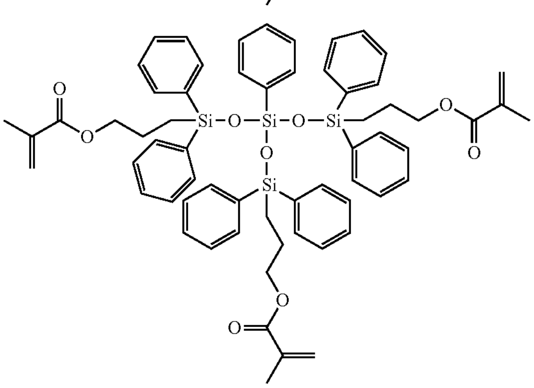

-continued

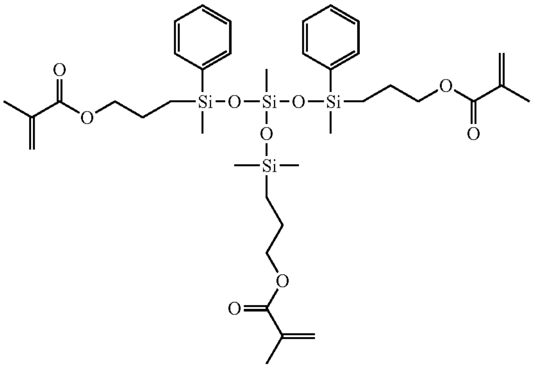

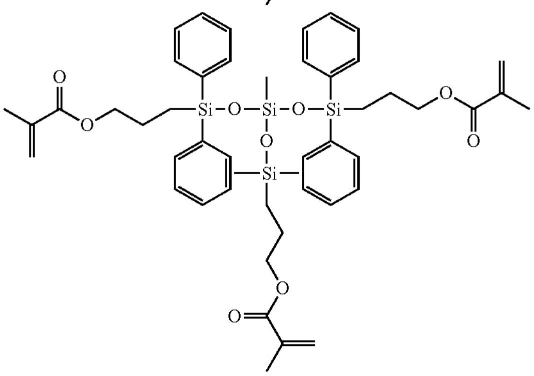

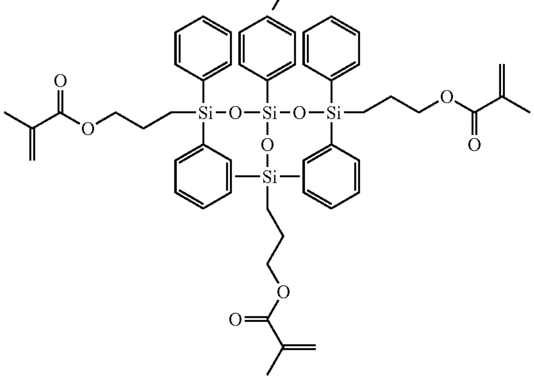

.

4. The composition for use in photoelectronic component encapsulated according to claim 1, wherein calculated by the weight percentage in the composition, the photocurable monomer is 10%~85%; the monofunctional or trifunctional silicon-containing monomer is 10%~70%; and the initiator is 0.5%~10%.

5. The composition for use in photoelectronic component encapsulated according to claim 1, wherein calculated by the weight percentage in the composition, the monofunctional or trifunctional silicon-containing monomer is 20%~50%, the photocurable monomer is 30%~70%, and the initiator is 0.5%~10%.

6. The composition for use in photoelectronic component encapsulated according to claim 1, wherein the photocurable monomer comprises at least one of C1 to C30 monoalcohol or polyalcohol monofunctional (meth) acrylate, C2 to C30 monoalcohol or polyalcohol bifunctional (meth) acrylate and C3 to C30 monoalcohol or polyalcohol multifunctional (meth) acrylate; and the mass ratio of the monofunctional acrylate to bifunctional acrylate is 1:(0.1~20), and the mass ratio of the monofunctional acrylate to the multifunctional acrylate is 1:(0.1~20).

7. The composition for use in photoelectronic component encapsulated according to claim 1, wherein the photoinitiator is one or variety of triazine, acetophenone, benzophenone, thioxanthone, benzoin, phosphorus, and oxime initiators or a mixture thereof.

8. An encapsulation structure, comprising a packaging layer, wherein the packaging layer is formed by ultraviolet light irradiation after the composition for use in photoelectronic component encapsulated according to claim 1 is attached by any one mode of flash evaporation, ink-jet printing, deposition, screen printing, spin coating or scraper coating.

9. A photoelectronic component, comprising a functional structure and an encapsulation structure, wherein the encapsulation structure is the encapsulation structure according to claim 8, the photoelectronic component is an organic light-emitting diode or a solar battery, the light curing rate is 90%~97%, and the light transmittance is 95%~99%.

10. An encapsulation structure according to claim 8, wherein the silicon-containing monomer contains at least one C6 to C30 substituted or unsubstituted aryl bonded to a silicon atom.

11. An encapsulation structure according to claim 8, wherein the silicon-containing monomer has a molecular weight of 200~2000 g/mol.

12. An encapsulation structure according to claim 8, wherein the silicon-containing monomer comprises the following structures:

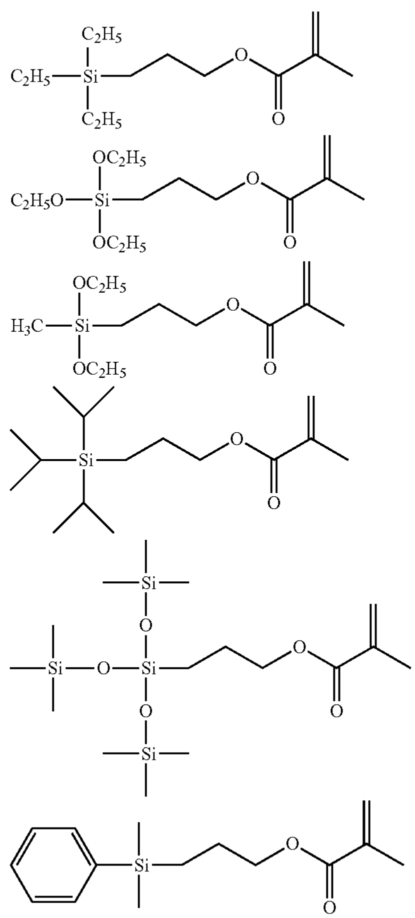

-continued

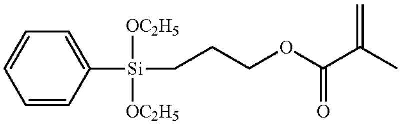

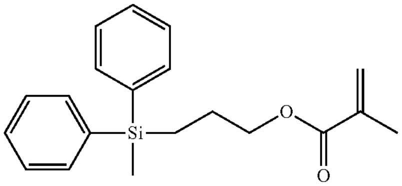

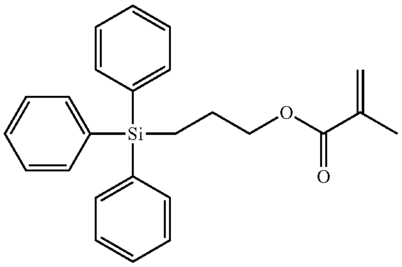

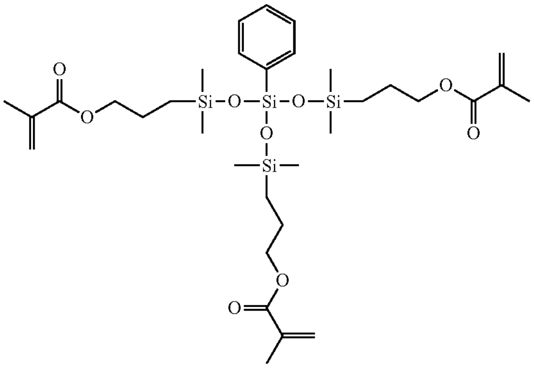

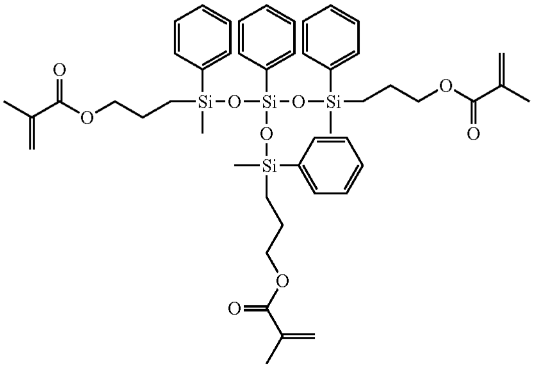

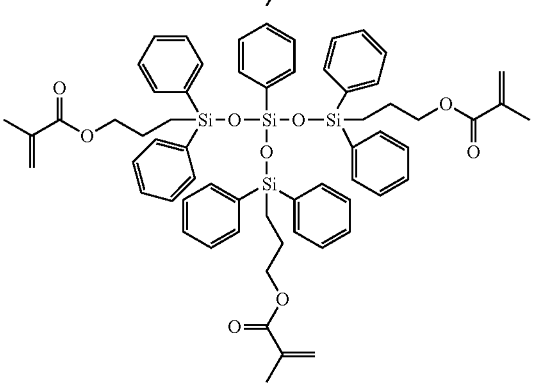

-continued

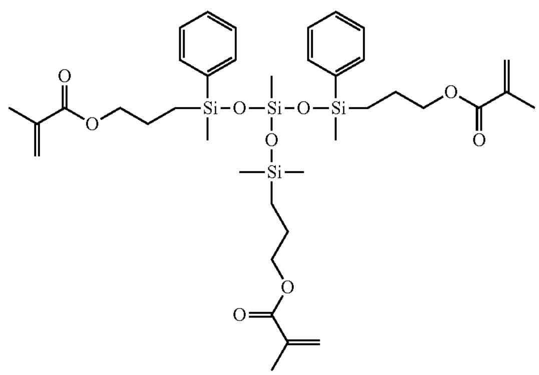

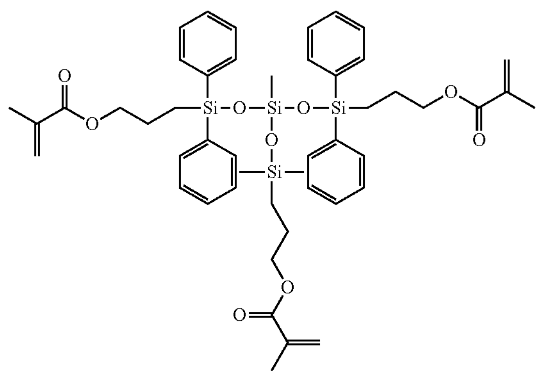

-continued

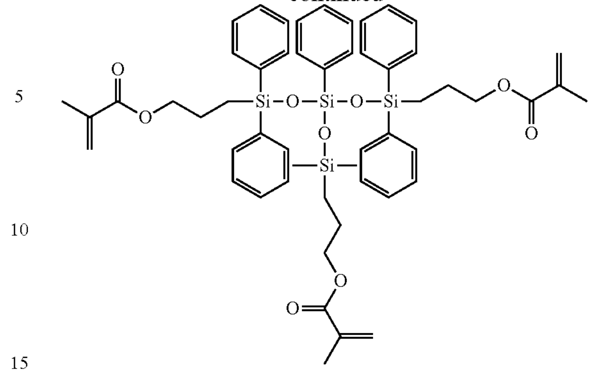

.

13. An encapsulation structure according to claim 8, wherein calculated by the weight percentage in the composition, the photocurable monomer is 10%~85%; the monofunctional or trifunctional silicon-containing monomer is 10%~70%; and the initiator is 0.5%~10%.

14. An encapsulation structure according to claim 8, wherein the photocurable monomer comprises at least one of C1 to C30 monoalcohol or polyalcohol monofunctional (meth) acrylate, C2 to C30 monoalcohol or polyalcohol bifunctional (meth) acrylate and C3 to C30 monoalcohol or polyalcohol multifunctional (meth) acrylate; and the mass ratio of the monofunctional acrylate to bifunctional acrylate is 1:(0.1~20), and the mass ratio of the monofunctional acrylate to the multifunctional acrylate is 1:(0.1~20).

15. An encapsulation structure according to claim 8, wherein the photoinitiator is one or variety of triazine, acetophenone, benzophenone, thioxanthone, benzoin, phosphorus, and oxime initiators or a mixture thereof.

* * * * *